United States Patent
Bradburn et al.

(10) Patent No.: US 6,873,640 B2
(45) Date of Patent: Mar. 29, 2005

(54) LASER DIODE COLLIMATING SYSTEM

(75) Inventors: Grahame Bradburn, Hertfordshire (GB); Norihisa Takada, London (GB)

(73) Assignee: Fujifilm Electronic Imaging Ltd., Herts (GB)

( * ) Notice: Subject to any disclaimer, the term of this patent is extended or adjusted under 35 U.S.C. 154(b) by 127 days.

(21) Appl. No.: 10/156,585

(22) Filed: May 24, 2002

(65) Prior Publication Data

US 2003/0142720 A1 Jul. 31, 2003

(30) Foreign Application Priority Data

Jan. 28, 2002 (EP) .............................................. 02250550

(51) Int. Cl.⁷ ................................................. H01S 3/08
(52) U.S. Cl. ............................ 372/101; 372/34; 372/36; 372/108; 359/644; 359/820
(58) Field of Search ............................. 372/34, 36, 101, 372/108; 359/644, 820, 641

(56) References Cited

U.S. PATENT DOCUMENTS

| | | | |
|---|---|---|---|
| 4,318,594 A | * | 3/1982 | Hanada ...................... 359/710 |
| 5,140,608 A | | 8/1992 | Karpol et al. |
| 5,181,224 A | * | 1/1993 | Snyder ........................ 372/101 |
| 5,216,687 A | * | 6/1993 | Fujino et al. .................. 372/70 |
| 5,790,576 A | * | 8/1998 | Waarts et al. ................. 372/43 |
| 5,900,981 A | | 5/1999 | Oren et al. |
| 6,044,096 A | | 3/2000 | Wolak et al. |
| 6,384,981 B1 | | 5/2002 | Hauschild |
| 6,469,294 B2 | * | 10/2002 | Ohkawa et al. ............. 250/235 |

FOREIGN PATENT DOCUMENTS

EP    0 387 014 A1    9/1990
WO    WO 99/57791 A1    11/1999

* cited by examiner

Primary Examiner—Minsun Oh Harvey
Assistant Examiner—Delma R. Flores-Ruiz
(74) Attorney, Agent, or Firm—Sughrue Mion, PLLC

(57) ABSTRACT

A laser diode collimating system comprises a collimating lens for receiving a laser beam from a laser diode LD. First and second orthogonally arranged cylindrical lenses are provided through which the laser beam passes. The cylindrical lenses are positioned so as to have a substantially common focal plane and operate substantially independently on the divergence and/or convergence of the laser beam in its fast axis and slow axis directions respectively. A convex lens, through which the beam passes, has a focus lying in the said common focal plane.

11 Claims, 4 Drawing Sheets

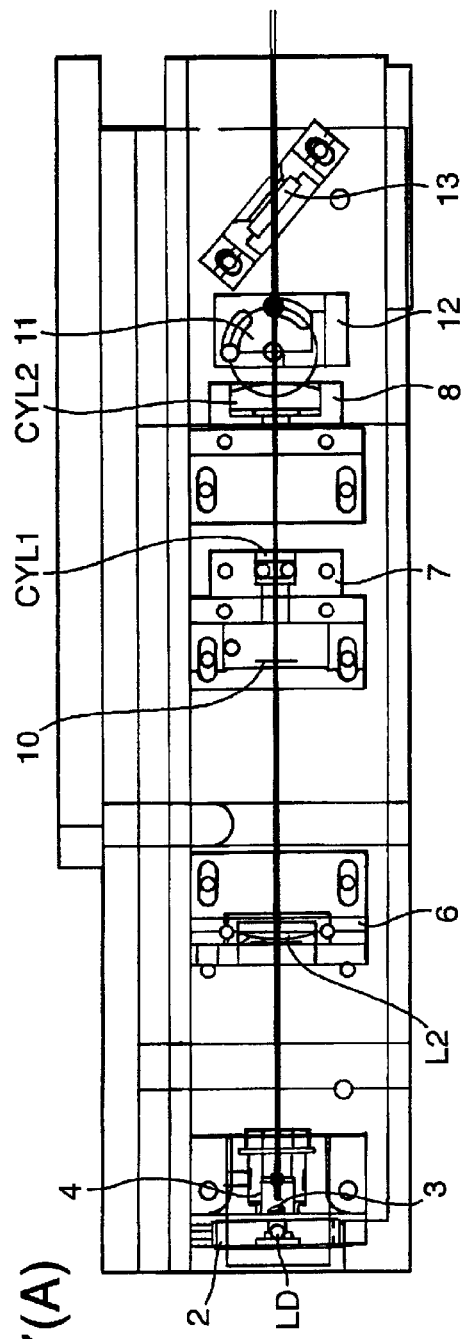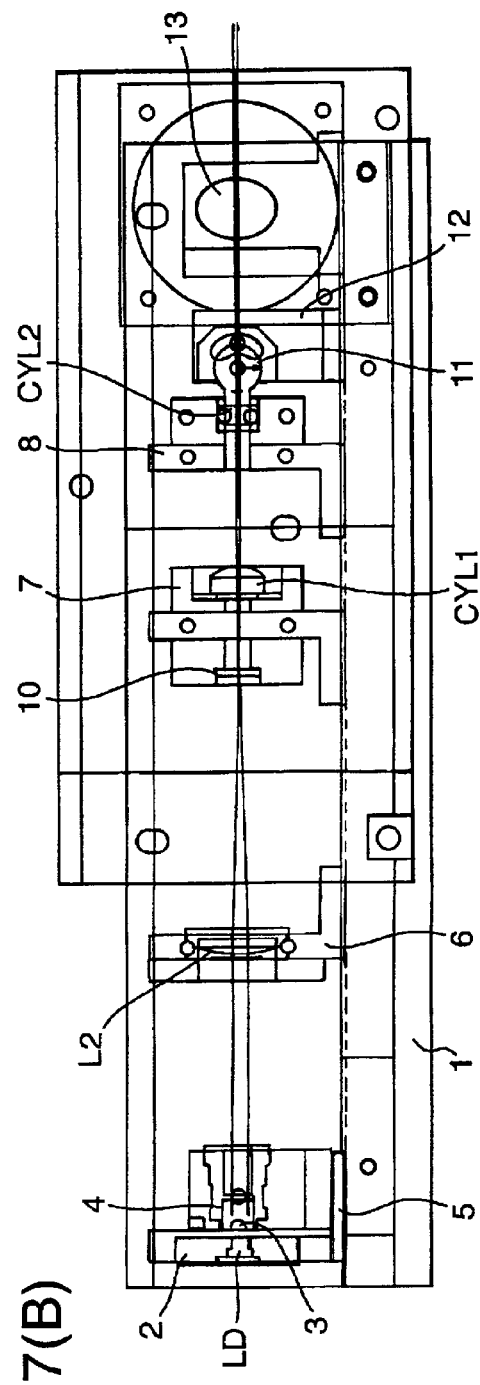
Fig.7(A)
Fig.7(B)

LASER DIODE COLLIMATING SYSTEM

FIELD OF THE INVENTION

The invention relates to a laser diode collimating system.

DESCRIPTION OF THE PRIOR ART

Laser beam modules that produce circularised, collimated laser output using a laser diode are particularly suitable for Violet plate CTP (Computer-to-plate) recording machines which need a circular beam, high efficiency with high quality (small focus error, low astigmatism and low sidelode) from a violet laser diode. Many methods have been proposed around laser diode beam forming, but none of them meet the requirement for this purpose.

One method uses a collimating lens and an aperture only to circularise the laser beam. The aperture reduces the transmission efficiency and produces large sidelobes caused by diffraction effects. Some suppliers produce nearly circularised laser diodes by placing micro-optics into the laser diode "can" and such laser diodes are convenient for the method. Even though efficiency is not an issue, the position of the collimating lens is so sensitive to the focus position that it must be controlled very precisely. Furthermore, additional elements or means are necessary to correct astigmatism which is inherent with laser diodes.

A second process uses a collimating lens and a prism pair. Prisms can circularise the beam from various laser diodes with good efficiency, however the lens determines collimation, so it has to be aligned very accurately. In addition, some other means must be employed to correct for astigmatism. To reduce the beam size, additional optics are required. For applications that require small collimated beam sizes, e.g. 1 mm diameter, prisms are not necessarily the preferred option as they are generally used to expand beam sizes (not reducing) to ensure reasonable optical efficiency. Hence the required optics are likely to become complicated.

An alternative method uses a collimating lens and two cylindrical lenses. The lenses can be used for slow axis beam size conversion, but they also have to be used for fast axis beam size conversion for small, collimated beam output, e.g. 1 mm diameter. This method is useful for the collimation and beam sizing of limited aspect ratio laser diodes where beam circulation can be aided with the placement of an aperture in the beam path with little or no induced optical efficiency loss.

Though the astigmatism along the cylindrical lenses axis can be easily corrected for, collimation lens alignment is not so easy. The reason is that laser beam divergence for the slow axis is determined by the position of the collimating lens and is very sensitive to this position of focus, and thus must be accurately aligned. Although this design may seem to have a reasonable capability, apart from the collimation lens sensitivity concern, there is no function to correct for the off-axis astigmatism that may well be produced by the surface shape error or alignment error in the optics.

SUMMARY OF THE INVENTION

In accordance with the present invention, a laser diode collimating system comprises a collimating lens for receiving a laser beam from a laser diode in use; first and second orthogonally arranged cylindrical lenses through which the laser beam passes, the lenses being positioned so as to have a substantially common focal plane and operating substantially independently on the divergence and/or convergence of the laser beam in its fast axis and slow axis directions respectively; and a convex lens through which the beam passes, the convex lens having a focus lying in the said common focal plane.

The present invention overcomes the problems mentioned above and produces a high quality, circularised, collimated beam with good optical transmission efficiency.

The cylindrical lenses and convex lens can be arranged in a number of different configurations but in the preferred arrangements, either the cylindrical lenses are located between the collimating lens and the convex lens, or the cylindrical lenses are located downstream of the collimating lens and the convex lens.

In many cases, the required circularity is achieved with the lenses alone but in some cases, an aperture may be provided downstream of all the lenses so as to provide a final correction.

An aperture can also be positioned at the common focal plane to act as a spatial filter and to reduce the amount of undesirable light, for example fluorescence or (lambertian) scattered light from the laser diode.

BRIEF DESCRIPTION OF THE DRAWINGS

Some examples of laser diode collimating systems according to the invention will now be described with reference to the accompanying drawings, in which:

FIGS. 1A, 1B to 6A, 6B illustrate six different examples of systems according to the invention;

FIGS. 7A and 7B are a plan and side elevation of an assembly drawing of the FIG. 6 configuration; and, FIG. 8 is a cross-section through the laser diode holding assembly.

DESCRIPTION OF THE EMBODIMENTS

In each of FIGS. 1 to 7, the "A" diagram shows the components in the fast axis direction and the "B" diagram in the slow axis direction where the fast and slow axes relate in a conventional manner to the laser diode concerned.

Figure 1A:
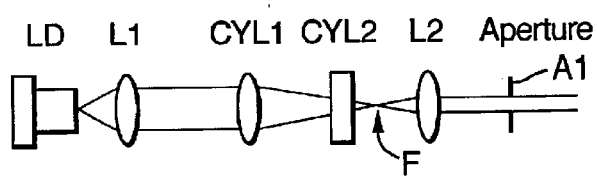
Figure 1B:
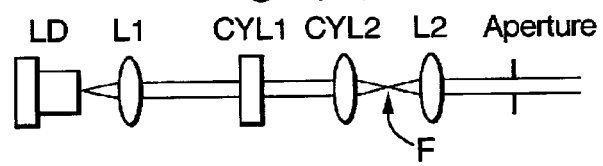

Thus, as can be seen in FIGS. 1A and 1B, a laser diode LD generates a laser beam which is fed to a high NA collimating lens L1 positioned and aligned to obtain a near collimated beam from the laser diode. A low NA spherical lens L2 and a cylindrical lens CYL1 compose an optical expander for the fast axis correction of the laser diode. L2 and another cylindrical lens CYL2 compose an optical expander for the correction of the slow axis. An aperture A1 is placed at the end of the optical path to compensate for residual ellipticity and therefore circularises the laser beam. The cylindrical axes of the cylindrical lenses CYL1 and CYL2 are positioned orthogonally to each other.

It will be noted in FIG. 1 that the focal plane of the cylindrical lenses CYL1 and CYL2 is substantially coincident as shown at F.

Figure 2A:
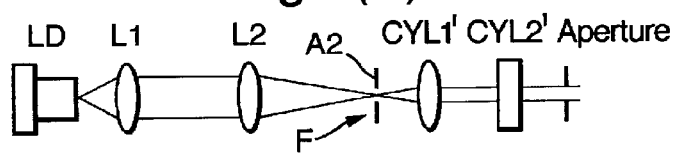
Figure 2B:
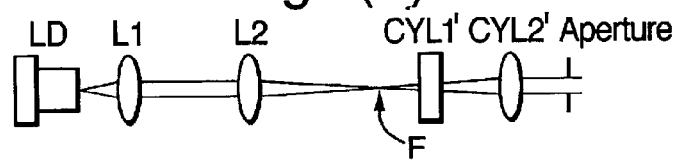
Figure 3A:
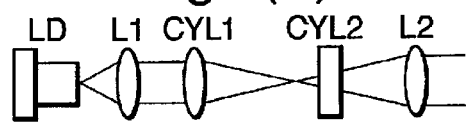
Figure 3B:
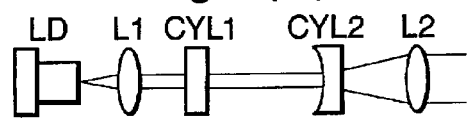
Figure 4A:
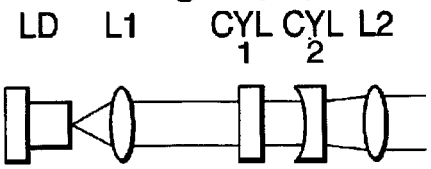
Figure 4B:
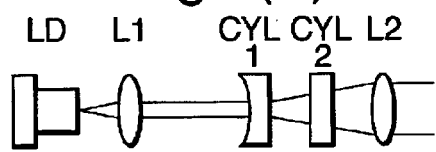
Figure 5A:
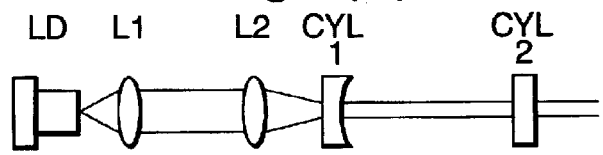
Figure 5B:
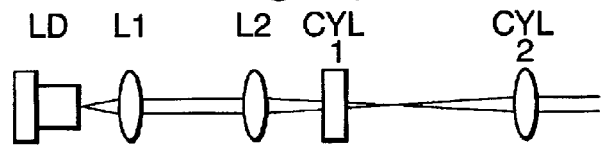

In the FIG. 2 example, the lens L2 is located upstream of the cylindrical lenses CYL1 and CYL2 but otherwise the optical arrangement is the same with a common focal plane F for the cylindrical lenses.

These configurations have several advantages. L1 alone does not determine the divergence of the output beam, so it need only be roughly aligned. Divergence can be easily controlled using L2. By controlling the divergence (or convergence) of the output of L1, the collimated laser beam diameter from the laser module can be adjusted. Using this method, the fast or slow axis of the laser beam can be adjusted to the desirable size from various laser diodes.

In another aspect, L1 is sensitive to any errors from the ideal designed condition due to high NA. For example, a change in wavelength or can window thickness of a laser diode will induce aberration. Such aberrations can be minimised with the preferred alignment of L1 and L2. Slow and fast axis divergence produced by a laser diode can be controlled by means of independent alignment of CYL1 and CYL2, and hence astigmatism can be completely compensated for. The axes of the CYL1 and CYL2 elements are nominally orthogonal. Any error in this orthogonality will induce 45° astigmatism. The amount of this astigmatism is a function of the rotation angle. Thus 45° that astigmatism can be completely cancelled out by adjusting the rotational angle of the cylindrical lenses.

The cylindrical lenses are preferably singlets due to the manufacturing difficulty, so they have to be used at small NA so as to minimise any induced aberration. However, that solution will increase the focal length of each lens, hence the overall length of the laser module becomes longer. The spherical lens, L2, can be multi-element or an aspheric lens, hence the lens can compensate for the aberration produced by the cylindrical lens elements, or even can compensate the residual aberration produced by the first collimating lens, L1. This solution will result in a more compact laser diode module. An aperture A2 can be positioned at the focus position in the laser module, acting as a spatial filter and reducing the amount of undesirable light, i.e. fluorescence or (lambertian) scattered light from the laser. The aperture A2 will result in improved laser module extinction ratio when the laser diode LD is modulated on/off. Furthermore, a final aperture A1 is used to circularise the beam, but since the beam at this point is almost circularised in any case, the power loss and diffraction effects at this aperture are small.

FIGS. 3 to 6 illustrate four further configurations in which one or both of the cylindrical lenses CYL1, CYL2 has a negative curvature.

Figure 6A:
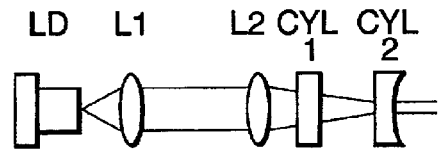
Figure 6B:
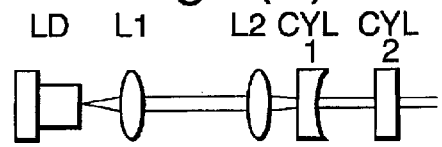

A more detailed mechanical diagram of the FIG. 6 example is shown in FIGS. 7A and 7B. The components are mounted on a baseplate 1. A laser diode LD is pushed into a laser mount 2. A high NA collimating lens 3, preferably a glass molded aspheric lens, is press-fitted into a lens holder 4. A thermo electric cooler 5 is used to control the temperature of the laser diode and the collimating lens. The laser diode can be rotated to align the polarisation axis and can be positionally shifted in the X and Y directions to align the emitting point of the diode to the collimating lens axis. The collimating lens 3 can be adjusted back and forward with respect to the position of the diode to adjust the divergence condition.

Lenses L2 (spherical), CYL1 and CYL2 (cylindrical lens elements) on their respective mounts 6–8 can be shifted in the X, Y and Z directions with respect to the position of the laser diode to correct for shift and focus error. CYL1 and CYL2 lens elements can be rotated parallel to the laser beam axis in order to align their axis to the laser divergence axis. Additional small adjustment of CYL1 or CYL2 can be made to compensate for off-axis astigmatism.

A first aperture 10 is placed at the focus position to eliminate undesirable light. A second aperture 11 is placed at the end of the module. The size of the aperture is preselected to get the desired beam size. The aperture is attached on a gimbal mount 12 so it can be tilted in two axes to correct for any residual ellipticity. A glass plate 13 defining a beam splitter is placed near the Brewster's angle to reflect a fraction of the collimated light toward a photo detector (not shown) that is used for stabilising the power with feedback control.

Figure 8:
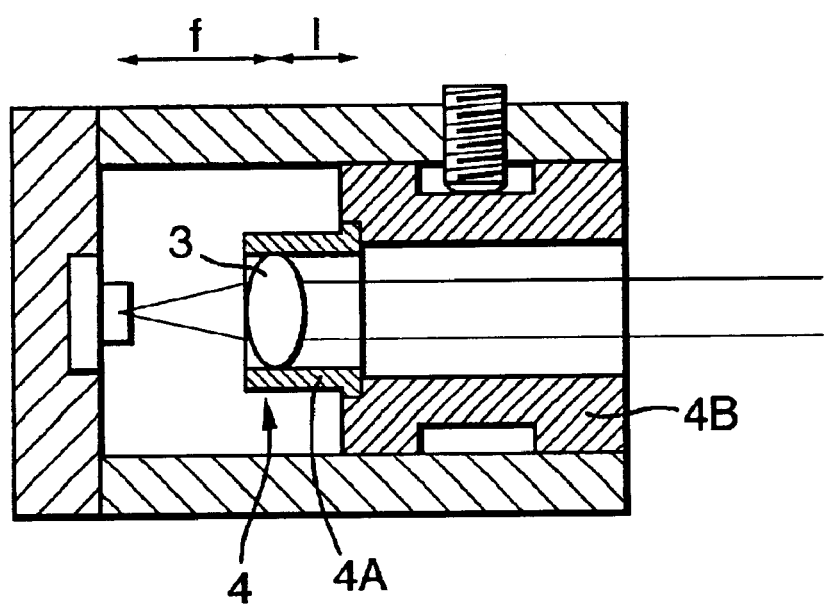

As can be seen in FIG. 8, the lens holder 4 is made of two parts 4A,4B with holder part 4A pushed into holder part 4B. Once the distance between the lens and LD is adjusted, it is fixed with screws.

Though most if the parts of the holder 4 are aluminium because of its good thermal conductivity and cost, the holder part 4A is made by a different material in order to keep the collimating status throughout a working temperature range. This can be explained as follows:

If the holder parts 4A,4B were both aluminium, the change in focal position df with temperature would be as follows.

$$Df=(ft-f*a)*t$$

f: focal length of the lens
a: thermal expansion of holder part 4A and holder part 4B
ft: focal length change of the lens per degC
t: temperature difference (degC)
Unless $f*a=ft$, the collimating condition would change significantly. For example, if $a=23\times10e-6$, $f=4$ mm and $ft=150\times10e-6$ mm/deg, then $df=58\times10e-6$ mm/deg.

If a different material is used for holder part 4A, the formula would be as follows:

$$df=(ft-f*a-l*(a-b))*t$$

b: thermal expansion of the holder part 4A material
l: length of the holder part 4A
In this case, the material and length of the material of the holder part 4A can be chosen so that $ft-f*a=l*(a-b)$. For example, if the holder part 4A was made of silver steel ($b=11\times10e-6$) and $l=5$ mm, then $df=-2\times10e-6$ mm/deg.

We claim:

1. A laser diode collimating system comprising a collimating lens for receiving a laser beam from a laser diode in use; first and second orthogonally arranged cylindrical lenses through which the laser beam passes, the lenses being positioned so as to have a substantially common focal plane and to operate substantially independently on the laser beam in its fast axis and slow axis directions respectively so as to bring the laser beam in both the fast axis and slow axis directions to a focus in a substantially common plane; and a convex lens through which the beam passes, the convex lens having a focus lying in the said common focal plane.

2. A system according to claim 1, wherein the cylindrical lenses each have a focusing power of the same sign.

3. A system according to claim 1, wherein the cylindrical lenses are located between the collimating lens and the convex lens.

4. A system according to claim 1, wherein the cylindrical lenses are located downstream of the collimating lens and the convex lens.

5. A system according to claim 1, wherein the collimating lens has a higher numerical aperture (NA) than the convex lens.

6. A system according to claim 1, further comprising a first aperture located in or adjacent to the said common focal plane.

7. A system according to claim 1, further comprising a second aperture downstream of all the lenses so as to provide a final ellipticity correction.

8. A system according to claim 7, wherein the second aperture is mounted on a support to enable the aperture to be tilted in two transverse axes.

9. A system according to claim 1, wherein the collimating lens has a NA greater than 0.25.

10. A system according to claim 1, wherein the convex lens has a NA of less than 0.1.

11. A system according to claim 1, wherein the collimating lens is supported on a mount comprising two different components chose such that in use, the distance between the laser diode and the collimating lens can be maintained constant throughout a working temperature range.

* * * * *